(12) United States Patent
Roggenbauer et al.

(10) Patent No.: US 8,188,543 B2
(45) Date of Patent: May 29, 2012

(54) ELECTRONIC DEVICE INCLUDING A CONDUCTIVE STRUCTURE EXTENDING THROUGH A BURIED INSULATING LAYER

(75) Inventors: Todd C. Roggenbauer, Chandler, AZ (US); Vishnu K. Khemka, Phoenix, AZ (US); Ronghua Zhu, Chandler, AZ (US); Amitava Bose, Tempe, AZ (US); Paul Hui, Mesa, AZ (US); Xiaoqiu Huang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 152 days.

(21) Appl. No.: 11/556,576

(22) Filed: Nov. 3, 2006

(65) Prior Publication Data

US 2008/0122025 A1 May 29, 2008

(51) Int. Cl.
*H01L 27/01* (2006.01)
(52) U.S. Cl. .................. 257/354; 257/347; 257/349
(58) Field of Classification Search .......... 257/347–354
See application file for complete search history.

(56) References Cited

U.S. PATENT DOCUMENTS

| | | | |
|---|---|---|---|
| 5,489,790 A * | 2/1996 | Lage | 257/330 |
| 5,557,134 A | 9/1996 | Sugisaka et al. | |
| 5,565,697 A * | 10/1996 | Asakawa et al. | 257/347 |
| 5,708,287 A | 1/1998 | Nakagawa et al. | |
| 5,811,315 A | 9/1998 | Yindeepol et al. | |
| 5,825,067 A * | 10/1998 | Takeuchi et al. | 257/355 |
| 5,939,755 A | 8/1999 | Takeuchi et al. | |
| 5,945,712 A | 8/1999 | Kim | |
| 6,130,458 A * | 10/2000 | Takagi et al. | 257/351 |
| 6,303,413 B1 | 10/2001 | Kalnitsky et al. | |
| 6,429,502 B1 | 8/2002 | Librizzi et al. | |
| 6,611,024 B2 * | 8/2003 | Ang et al. | 257/350 |
| 6,617,223 B2 | 9/2003 | Wilson et al. | |
| 6,649,964 B2 | 11/2003 | Kim | |
| 6,670,716 B2 * | 12/2003 | Christensen et al. | 257/762 |
| 6,734,524 B1 | 5/2004 | Parthasarathy et al. | |
| 6,835,629 B2 * | 12/2004 | Fallica | 438/336 |
| 6,890,804 B1 | 5/2005 | Shibib et al. | |
| 6,930,027 B2 | 8/2005 | Parthasarathy et al. | |
| 7,052,939 B2 | 5/2006 | Huang et al. | |
| 7,265,584 B2 | 9/2007 | Yeh et al. | |
| 7,282,399 B2 | 10/2007 | Takahashi | |
| 7,561,472 B2 | 7/2009 | Doyle | |
| 2002/0081809 A1 | 6/2002 | Pinto et al. | |
| 2004/0099878 A1 | 5/2004 | Huang et al. | |
| 2004/0227185 A1* | 11/2004 | Matsumoto et al. | 257/347 |
| 2006/0051932 A1 | 3/2006 | Yoneda | |
| 2006/0063349 A1 | 3/2006 | Chang et al. | |
| 2006/0065924 A1 | 3/2006 | Yilmaz | |
| 2008/0017906 A1 | 1/2008 | Pelella et al. | |

OTHER PUBLICATIONS

Kawai, F. et al., "Multi-Voltage SOI-BiCDMOS for 14V&42V Automotive Applications," International Symposium on Power Semiconductor Devices & ICs, 2004, pp. 165-168.

(Continued)

*Primary Examiner* — Ori Nadav

(57) ABSTRACT

An electronic device can include a substrate, a buried insulating layer overlying the substrate, and a semiconductor layer overlying the buried insulating layer, wherein the semiconductor layer is substantially monocrystalline. The electronic device can also include a conductive structure extending through the semiconductor layer and buried insulating layer and abutting the substrate, and an insulating spacer lying between the conductive structure and each of the semiconductor layer and the buried insulating layer.

11 Claims, 18 Drawing Sheets

OTHER PUBLICATIONS

Schwantes, S. et al., "Impact of the Back Gate Effect on Bipolar Junction Transistors in Smart Power SOI Technologies," Proceedings of the 17th International Symposium on Power Semiconductor Devices & IC's, California, May 23-26, 2005, pp. 1-4.

Kawahashi, A., "A New-Generation Hybrid Electric Vehicle and Its Supporting Power Semiconductor Devices," Proceedings of 2004 International Symposium on Power Semiconductor Devices & ICs, 2004, pp. 23-29.

International Search Report for correlating PCT Patent Application No. PCT/US 07/79690 dated Mar. 20, 2008.

Non-Final Office Action for U.S. Appl. No. 11/556,544 dated Mar. 4, 2009.

Yang, E.S.; "Fundamentals of Semiconductor Devices," McGraw-Hill Book Co.; 5-6 Ohmic Contact; pp. 136-138 (1978).

Final Office Action for U.S. Appl. No. 11/556,544 dated Aug. 10, 2009.

Notice of Allowance mailed Jul. 16, 2010 in Related U.S. Appl. No. 11/556,544.

* cited by examiner

ELECTRONIC DEVICE INCLUDING A CONDUCTIVE STRUCTURE EXTENDING THROUGH A BURIED INSULATING LAYER

RELATED APPLICATION

This application is related to U.S. patent application Ser. No. 11/556,544 entitled "Process of Forming an Electronic Device Including a Conductive Structure Extending through a Buried Insulating layer" by Roggenbauer et al, filed on Nov. 3, 2006, which is assigned to the current assignee hereof and incorporated herein by reference in its entirety.

BACKGROUND

1. Field of the Disclosure

The present disclosure relates to electronic devices, and more particularly to electronic devices including conductive structures extending through buried insulating layers.

2. Description of the Related Art

For many years, the size of electronic components and the spacing between the electronic components have been decreasing. However, as electronic components within an electronic device are brought into closer proximity with one another, the problem of electronic interference, radio-frequency interference, or both between such electronic components becomes more pronounced. Deep trench structures have been used for electrical insulation between electronic components designed to operate at high voltages (approximately 40 volts and above). Yet existing processes for deep trench structures are not well suited for as field isolation regions between other electronic components having sub-micrometer design rules. Field isolation regions used for electrical insulation between those other electronic components are not well suited for high-voltage applications.

BRIEF DESCRIPTION OF THE DRAWINGS

Embodiments are illustrated by way of example and are not limited in the accompanying figures.

Figure 1:
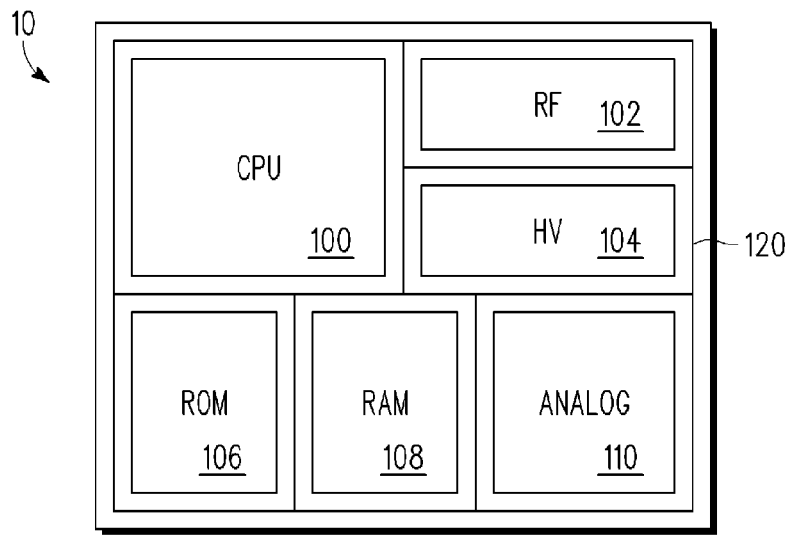
FIG. 1 includes a schematic view of an integrated circuit that includes its different sections in relation to one another and in relation to a conductive structure in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include different types of components over a substrate. For example, the electronic device can be designed to include a component or section that is designed for and operable to support a component that can operate at a high voltage, a component or section that can generate RF or other electromagnetic noise, and a component that is part of digital logic, all of which are part of the same integrated circuit.

As described below in accordance with various embodiments, features of the electronic device can improve performance and reduce adverse effects that can occur when components that can operate over widely different conditions are present within the same integrated circuit. A buried insulating layer can substantially prevent the substrate from being part of a parasitic bipolar or pnpn latching component. A combination of deep trenches with an insulating liner and a conductive structure therein can be formed and reduce the likelihood of forming a parasitic field-effect transistor along sidewalls of the deep trenches. The conductive structure can also be operated to filter or otherwise reduce RF or other electromagnetic noise from reaching components that are sensitive to the RF or other electromagnetic noise. The combination also helps to reduce other crosstalk issues, switching power dissipation, and reduce spacing between components. Further, the conductive structure can also be used to provide a substrate tie through the buried insulating layer. The doped region abutting the buried insulating layer can reduce a backgate effect. The link region within the semiconductor layer can be used as part of the component, can substantially eliminate formation of a parasitic field-effect transistor along the sidewall of the trench, or any combination thereof.

In one aspect, an electronic device can include a substrate, a buried insulating layer overlying the substrate, and a semiconductor layer overlying the buried insulating layer, wherein the semiconductor layer is substantially monocrystalline. The electronic device can also include a conductive structure extending through the semiconductor layer and buried insulating layer and abuts the substrate, and an insulating spacer lying between the conductive structure and each of the semiconductor layer and the buried insulating layer.

Before addressing details of embodiments described below, some terms are defined or clarified. The term "heavily doped," with respect to a layer or region, means that such layer or region has a dopant concentration of at least approximately $10^{17}$ atoms/cm$^3$. The term "lightly doped," with respect to a layer or region, means that such a doped layer or region is not heavily doped.

The term "high voltage," with respect to a component or section, means that such component or section is operable at voltages of at least approximately 40 volts. The term "low voltage," with respect to a component or section, means that such component or section is not a high voltage component or section. For example, a high voltage component can include terminals, wherein the high voltage component is operable when the voltage difference across the terminals is at least approximately 40 volts, and a low voltage component can include terminals, wherein the low voltage component is inoperable when the voltage difference across the terminals is at least approximately 40 volts.

Unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Unless otherwise defined, all technical and scientific terms used herein have the same meaning as commonly understood by one of ordinary skill in the art to which this invention belongs. All publications, patent applications, patent, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

The electronic device can include the integrated circuit by itself or can be a part or sub-assembly within a larger sub-assembly or assembly. Thus, the electronic device can be a circuit board, a computer, vehicle, or the like that includes any of the embodiments of the integrated circuits described herein.

In one embodiment, the electronic device can be an integrated circuit, such as integrated circuit 10 in FIG. 1. FIG. 1 includes a schematic diagram of an integrated circuit 10. The integrated circuit 10 can include a central processing unit ("CPU") 100, a radio-frequency ("RF") section 102, a high-voltage ("HV") section 104, a read only memory ("ROM") 106, a random access memory ("RAM") 108, and an analog section 110. In one embodiment, the CPU 100, the ROM 106, the RAM 108, the analog section 110, or any combination thereof include components that are designed such that they would not operate properly if voltage differences between terminals of those components exceed approximately 40 volts. Thus, the CPU 100, the ROM 106, the RAM 108, or any combination includes digital logic. The HV section 104 includes components that are designed such that they operate properly even when voltage differences between terminals of those components exceed approximately 40 volts. The RF section 106 includes components that generate RF or other electromagnetic noise that can adversely affect other components in other sections of the integrated circuit 10.

A conductive structure 120 lies between the each of the sections as illustrated in FIG. 1. Although not illustrated, more, fewer, or different sections may be present with integrated circuit 10. In one embodiment, the conductive structure 120 can extend through a buried insulating layer and abut the substrate (not illustrated in FIG. 1). When the integrated circuit 10 is operating, the conductive structure may be placed at a substantially constant voltage, such as a ground potential, $V_{DD}$, $V_{SS}$, or the like. The use of the conductive structure 120 can allow the integration of a variety of different types of components to be present within the same integrated circuit without components within one section significantly adversely affecting components within a different section. More specifically, components within the HV section 104 can operate without adversely affecting components in the other sections. Also, the conductive structure 120 can reduce (e.g., filter) RF or other electromagnetic noise before reaching other components within the other sections. Other benefits of the design are described in more detail later in this specification.

Figure 2:
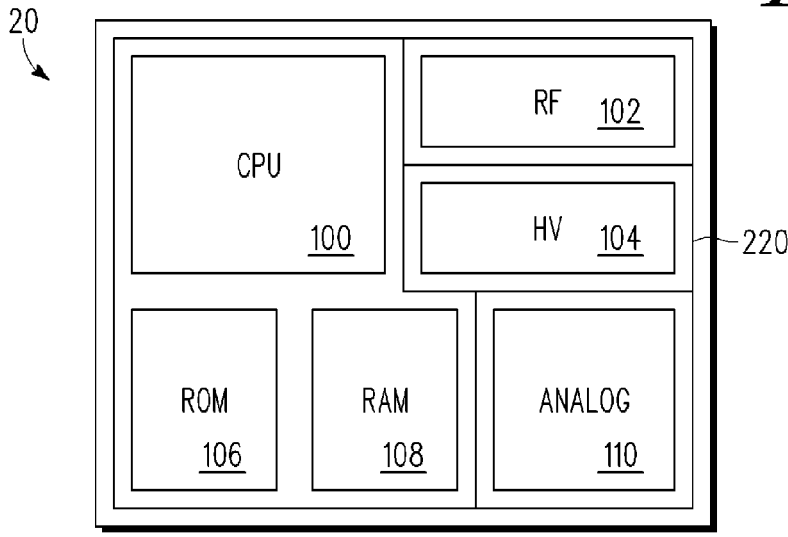
FIG. 2 includes a schematic view of an integrated circuit that includes its different sections in relation to one another and in relation to a conductive structure in accordance with another embodiment.

Different configurations can be used for the conductive structure to allow greater flexibility in designing and fabricating an integrated circuit. FIG. 2 includes a schematic diagram of an integrated circuit 20. The integrated circuit 20 includes the CPU 100, the RF section 102, the HV section 104, the ROM 106, the RAM 108, and the analog section 110. The conductive structure 220 may be changed so that portions of the conductive structure 222 do not lie between the CPU 100 and each of the ROM 106 and the RAM 108. In this particular embodiment, the relatively low-voltage, digital transistors within the CPU, the ROM 106, and the RAM 108 are separated from the HV section 104, the RF section 102, and the analog section.

Figure 3:
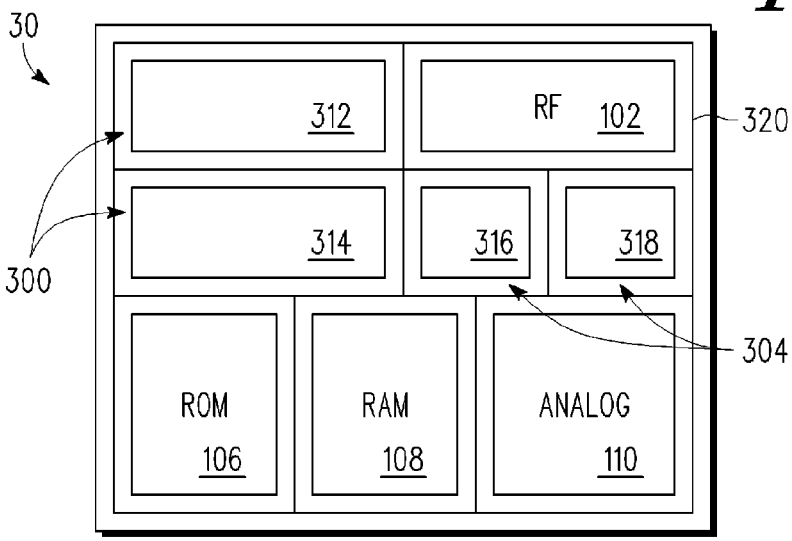
FIG. 3 includes a schematic view of an integrated circuit that includes its different sections in relation to one another and in relation to a conductive structure in accordance with yet another embodiment.

FIG. 3 includes a schematic diagram of an integrated circuit 30. In this particular embodiment, a CPU 300 includes a portion 312 and a portion 314, and an HV section 304 includes a portion 316 and a portion 318. With respect to the CPU 300, the portion 312 may include components that are relatively noisier when operating as compared to components within the portion 314, wherein the components within the portion 314 are relatively sensitive to the noise generated by the portion 312. In this manner, the conductive structure 320 includes a part that separates the portion 312 and the portion 314 from each other. With respect to the HV section 304, the biasing conditions for the portion 316 and the portion 318 may be such that without the conductive structure 320, an operation of a component within the portion 316 would interfere with an operation of a component within the portion 318, or vice versa. The conductive structure 320 allows components within the portion 316 and the portion 318 to be operated independent of one another.

After reading this specification, skilled artisans will appreciate that the conductive structure as used in the integrated circuit can have many different designs. Although not illustrated, more than one conductive structure may be used in an integrated circuit. In still another embodiment, the conductive structure surrounds the RF section 102 and the HV section 104, but no conductive structure surrounds the CPU 100, the ROM 106, or the RAM 108. In yet another embodiment, any of the various sections do not need to lie immediately adjacent to deep trenches that lie adjacent to conductive structures. Any of the components within a section can be spaced apart from the conductive structure and deep trench, as will be described in more detail with respect to FIGS. 20 and 21. The actual configuration or layout of the conductive structure(s) within an integrated circuit can be tailored to the particular application as needed or desired.

Figure 4:
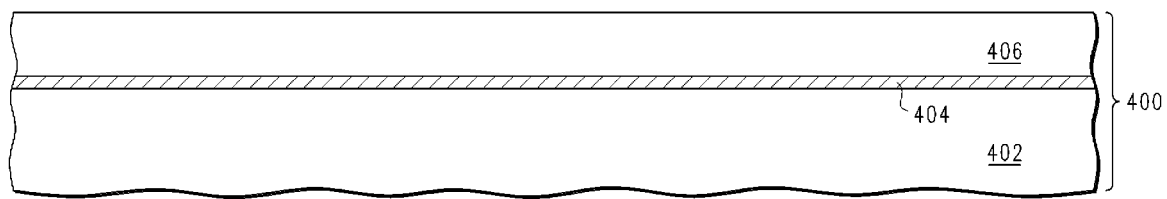
FIG. 4 includes an illustration of a cross-sectional view of a workpiece including a substrate, a buried insulating layer, and a semiconductor layer.

FIGS. 4 to 15 are described with respect to a process sequence that can be used in forming an integrated circuit that includes a conductive structure between components within the integrated circuit. FIG. 4 includes an illustration of a cross-sectional view of a semiconductor-on-insulator ("SOI") substrate 400. The SOI substrate 400 can include a semiconductor substrate (base material) 402, a buried insulating layer 404, and a semiconductor layer 406. Each of the semiconductor substrate 402 and the semiconductor layer 406 include the same or different semiconductor elements, and are of the same or different conductivity types. In a particular embodiment, each of the substrate 402 and the semiconductor layer 406 are lightly p-type doped. The buried insulating layer 404 may include one or more insulating films that include an oxide, a nitride, an oxynitride, or any combination thereof. In one embodiment, the buried insulating layer 404 has a thickness in a range of approximately 0.2 to 3.0 microns, and the semiconductor layer 406 has a thickness in a range of approximately 0.4 to 3.0 microns. In another embodiment, the thicknesses of the buried insulating layer 404 and the semiconductor layer 406 may be thicker or thinner that the thicknesses previously described. In a particular embodiment, the buried insulating layer 404 includes a layer of silicon dioxide. The SOI substrate 400 can be obtained from a commercially available source or fabricated using conventional or proprietary techniques.

Figure 5:
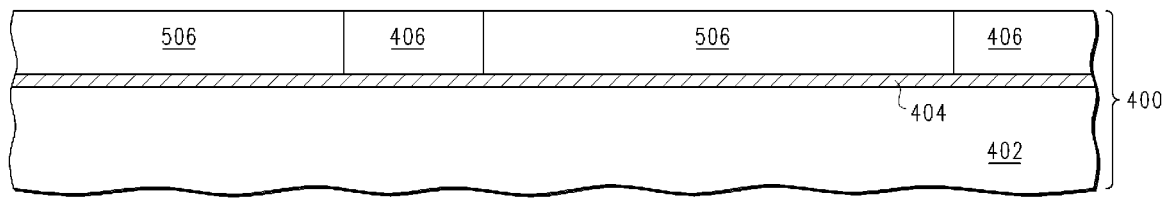
FIG. 5 includes an illustration of a top view of the workpiece of FIG. 4 after doping portions of the semiconductor layer.

FIG. 5 includes an illustration of a cross-sectional view of the SOI substrate 400 after portions of the semiconductor layer 406 have been doped to create doped regions 506. The doped regions 506 have a different conductivity type as compared to the semiconductor layer 406. In one particular embodiment, the doped regions 506 are heavily n-type doped with antimony, arsenic, or any combination thereof. The doped regions 506 can act as $N^+$ buried layers (also called $N^+$ buried regions) for subsequently formed electronic components. The doped regions 506 can be formed by using a conventional or proprietary implantation or furnace doping technique.

Figure 6:
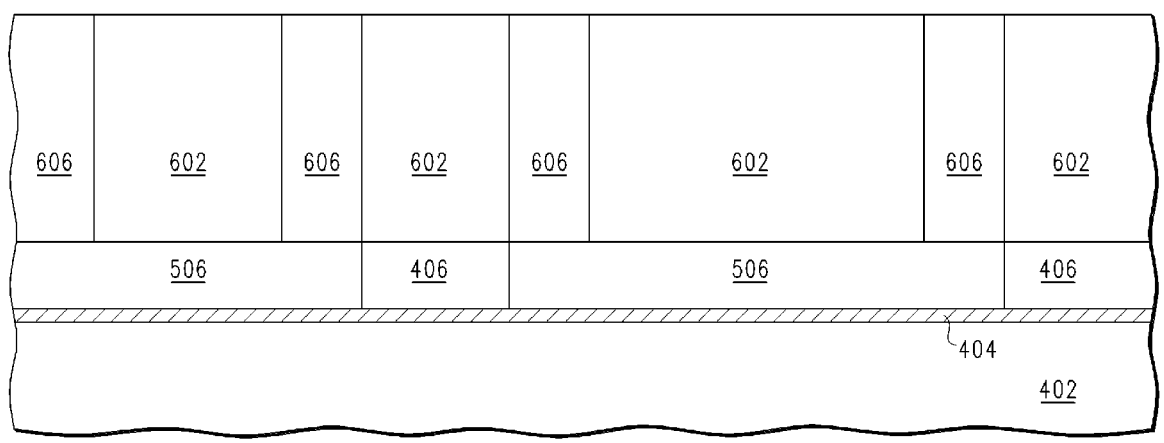
FIG. 6 includes an illustration of a cross-sectional view of the workpiece of FIG. 5 after forming another semiconductor layer and link regions therein.

FIG. 6 includes an illustration of a cross-sectional view of the integrated circuit after forming a semiconductor layer 602 over the semiconductor layer 406 and doped regions 506 and after forming link regions 606 within the semiconductor layer 602. In one embodiment, the semiconductor layer 602 includes silicon, germanium, carbon, or any combination thereof. The semiconductor layer 602 and the link regions 606 are formed during one or more iterative sequences. In one embodiment, the semiconductor layer 602 can be formed to its full thickness and the link regions 606 can be formed to extend from the doped regions 506 through the entire thickness of the semiconductor layer 602. In another embodiment, the entire thickness of the semiconductor layer 602 can be formed, and the link regions 606 are formed such that they extend from the doped regions 506 only partially through the semiconductor layer 602. In other words, the link regions 606 would not extend to the uppermost surface of the semiconductor layer 602 as illustrated in FIG. 6.

In still another embodiment, a first portion of the semiconductor layer 602 is formed, link regions 606 are formed within that portion of the semiconductor layer 602, and another portion of the semiconductor layer 602 is formed over that first portion of the semiconductor layer 602 and link regions 606. In yet another embodiment, the semiconductor layer 602 includes the first portion, and another portion of the semiconductor layer 602 includes different regions having different semiconductor compositions. For example, the other portion can include monocrystalline silicon except where high-performance p-channel transistors are being formed. Silicon germanium is formed where the high-performance p-channel transistors will be subsequently fabricated. In still another embodiment, a different semiconductor material, a III-V semiconductor material, a II-VI semiconductor material or the like may be formed. In one particular embodiment, the portion with the III-V semiconductor material or the II-VI semiconductor material is in the RF section 102 and is at a location where a circuit is subsequently formed. The circuit used to modulate a signal from baseband to a particular carrier frequency or to demodulate a signal from a particular carrier frequency to baseband. After reading this specification, skilled artisans will appreciate that other arrangements of semiconductor compositions can be used in forming an integrated circuit.

In one embodiment, the semiconductor layer 602 is lightly doped and has the same conductivity type as the semiconductor layer 406. The link regions 606 are heavily doped and have a conductivity type opposite the semiconductor layer 602. In a particular embodiment, the link regions 606 have a lower dopant concentration and as compared to the doped regions 506. In other embodiments, the link regions 606 have the same or a higher dopant concentration as compared to the doped regions 506. In one embodiment, a combination of a doped region 506 and a link region 606 may be part of a collector for a bipolar transistor. The semiconductor layer 602 can be formed using a conventional or proprietary epitaxial deposition technique. The link regions 606 can be formed using a conventional or proprietary implantation or furnace doping technique.

Figure 7:
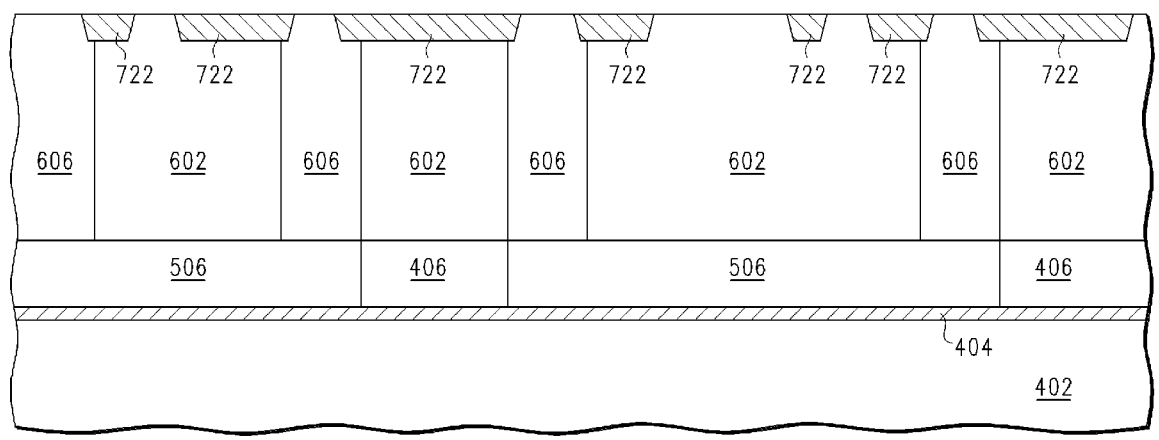
FIG. 7 includes an illustration of a cross-sectional view of the workpiece of FIG. 6 after forming field isolation regions.

FIG. 7 includes an illustration of a cross-sectional view forming field isolation regions 722. The field isolation regions 722 are shallow trench field isolation regions, local oxidation of silicon ("LOCOS") field isolation regions, other suitable field isolation regions, or any combination thereof In one embodiment, the field isolation regions 722 extend into the semiconductor layer 602 to a depth of approximately 0.11 to approximately 0.9 µm. In a particular embodiment, the field isolation regions 722 extend 0.2 to approximately 0.5 µm into the semiconductor layer 602. The field isolation regions 722 may completely or only partially extend into the semiconductor layer 602. The field isolation regions 722 are formed using a conventional or proprietary field isolation process.

Figure 8:
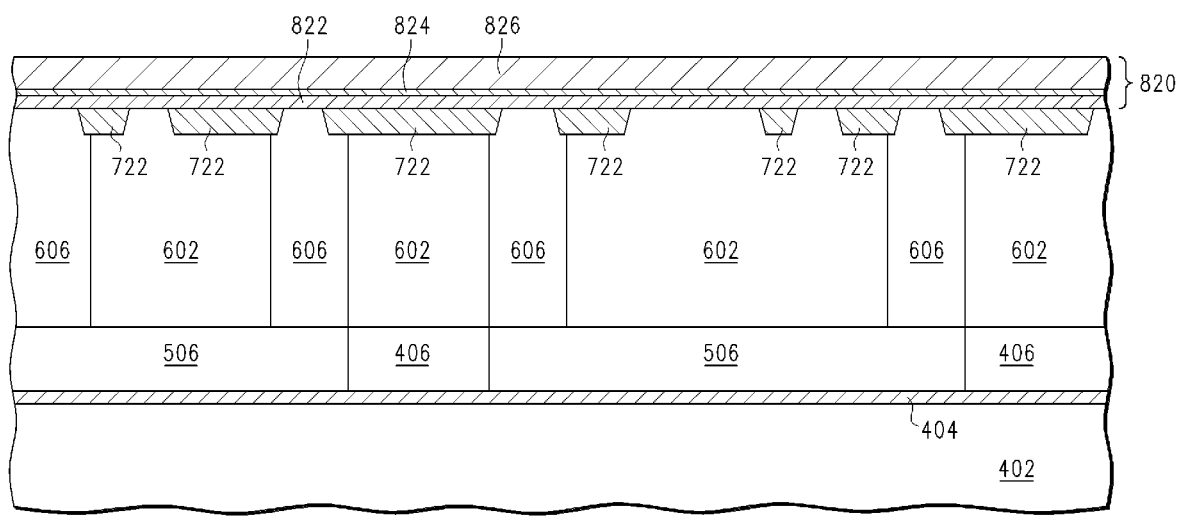
FIG. 8 includes an illustration of a cross-sectional view of the workpiece of FIG. 7 after forming a hard mask layer.

FIG. 8 includes an illustration of a cross-sectional view after forming a hard mask layer 820. In one embodiment, the hard mask layer 820 includes an oxide film 822, a nitride film 824, and another oxide film 826. The nitride film 824 can act as a protective layer, such that if too much of the oxide film 826 is eroded during a subsequent etch operation, the nitride film 824 protects underlying portions of the field isolation regions 722 and the semiconductor layer 602. In the embodiment as illustrated in FIG. 8, the oxide film 822 acts as a pad layer between the nitride film 824 and the semiconductor layer 602. In one embodiment, the oxide film 822 has a thickness in a range of approximately 5 to approximately 50 nm, the nitride film 824 has a thickness in a range of approximately 50 to approximately 250 nm, and the oxide film 826 has a thickness in a range of approximately 50 to 900 nm. In another embodiment, the oxide film 822, the nitride film 824, the oxide film 826, or any combination thereof has a thickness that is thicker or thinner than the range of thicknesses previously described. In another embodiment, the hard mask layer 820 has a different composition than the one described. For example, the hard mask layer 820 can include more or fewer films. In still another embodiment, the hard mask layer 820 can include a varying composition that changes as a function of thickness. The hard mask layer 820 is formed using a conventional or proprietary growth or deposition technique.

Figure 9:
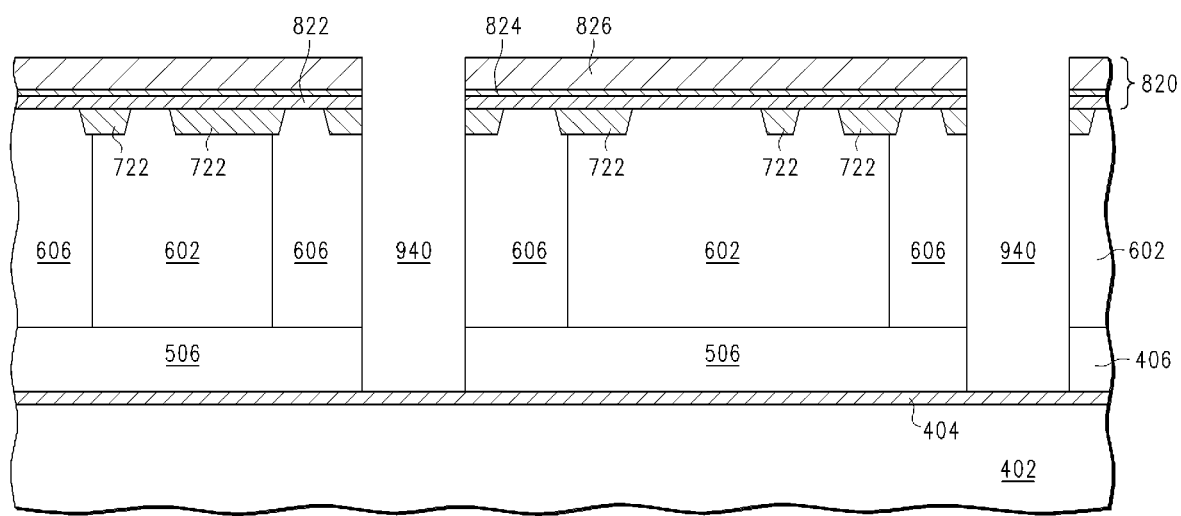
FIG. 9 includes an illustration of a cross-sectional view of the workpiece of FIG. 8 after forming trenches extending through the hard mask layer and semiconductor layers to expose portions of the buried insulating layer.

FIG. 9 includes an illustration of a cross-sectional view after forming trenches 940 that extend through the hard mask layer 820; the field isolation regions 722, the semiconductor layer 602, the link regions 606, or any combination thereof; and the semiconductor layer 406, doped regions 506, or any combination thereof to expose portions of the buried insulating layer 404. Although not illustrated, a resist mask is formed over portions of the hard mask layer 820 and includes openings corresponding to locations where the trenches 940 will be formed. A conventional etching process is used to etch the trenches that expose portions of the buried insulating layer 404 along the bottoms of the trenches 940. The etching of the layers and regions for the trenches 940 can be performed using a conventional or proprietary technique. In one embodiment, the trenches 940 have depths in a range of approximately 1.1 to approximately 9 µm, and in another embodiment, the trenches 940 have widths in a range of approximately 1.1 to approximately 5 µm. In other embodiments, the trenches 940 may be shallower or deeper, narrower or wider than the ranges previously described. In another embodiment (not illustrated), the trenches 940 can be extended through the buried insulating layer 404 and expose the semiconductor substrate 402. After the trenches 940 are formed, the resist mask can be removed using a conventional or proprietary ashing technique.

At this point in the process, the semiconductor layer 406 and the semiconductor layer 602 are in the form of mesas. The mesas having outer perimeters that correspond to inner perimeters of the trenches 940 and a subsequently-formed conductive structure. Some or all of the link regions 606 may lie along the outer perimeter of their corresponding mesas.

Figure 10:
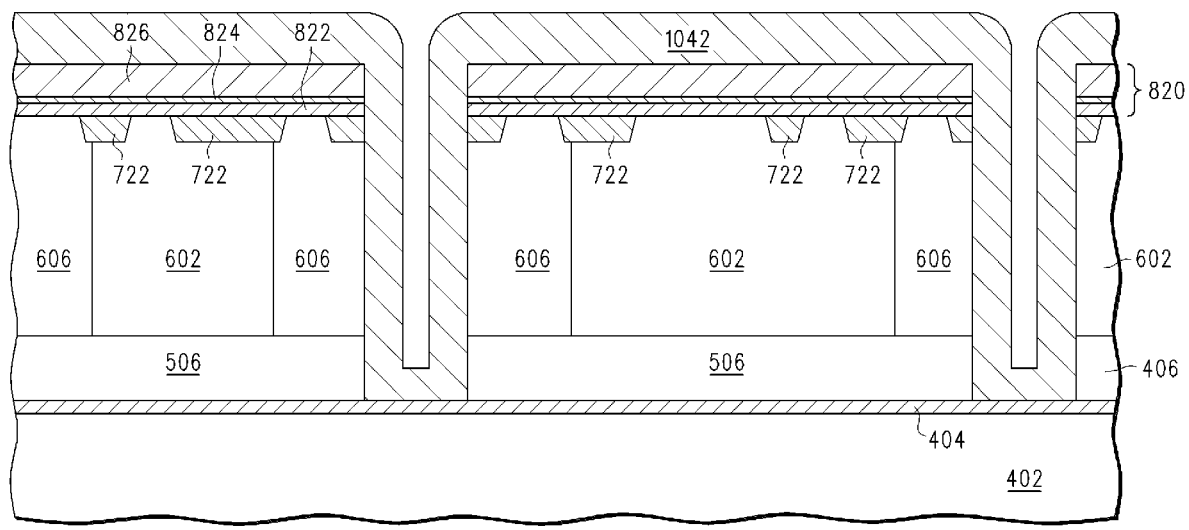
FIG. 10 includes an illustration of a cross-sectional view of the workpiece of FIG. 9 after forming an insulating layer to partially fill the trenches.

FIG. 10 includes an illustration of a cross-sectional view after forming an insulating layer 1042. The insulating layer 1042 includes one or more films having an oxide, a nitride, an oxynitride, or any combination thereof The insulating layer 1042 is deposited substantially conformally along the exposed surfaces of the hard mask layer 820 and along the sidewalls and bottoms of the trenches 940. The thickness of the insulating layer 1042 is chosen such that the trenches 940 are not substantially completely filled. For example, the insulating layer 1042 is deposited such that its thickness is no more than one half of the widths of the trenches 940. In one embodiment the insulating layer 1042 has a thickness in a range of approximately 0.11 to approximately 0.9 microns. In another embodiment, the insulating layer 1042 has a thickness thicker or thinner than the thicknesses previously described. In a particular embodiment, the insulating layer 1042 is deposited using an atmospheric chemical vapor deposition process. In another embodiment, a low-pressure chemical vapor deposition process can be used, as long as the deposition parameters are selected such that the insulating layer 1042 has a significant portion deposited along the exposed surfaces of the trenches 940. In other words, the insulating layer 1042 does not have to be substantially conformal.

Figure 11:
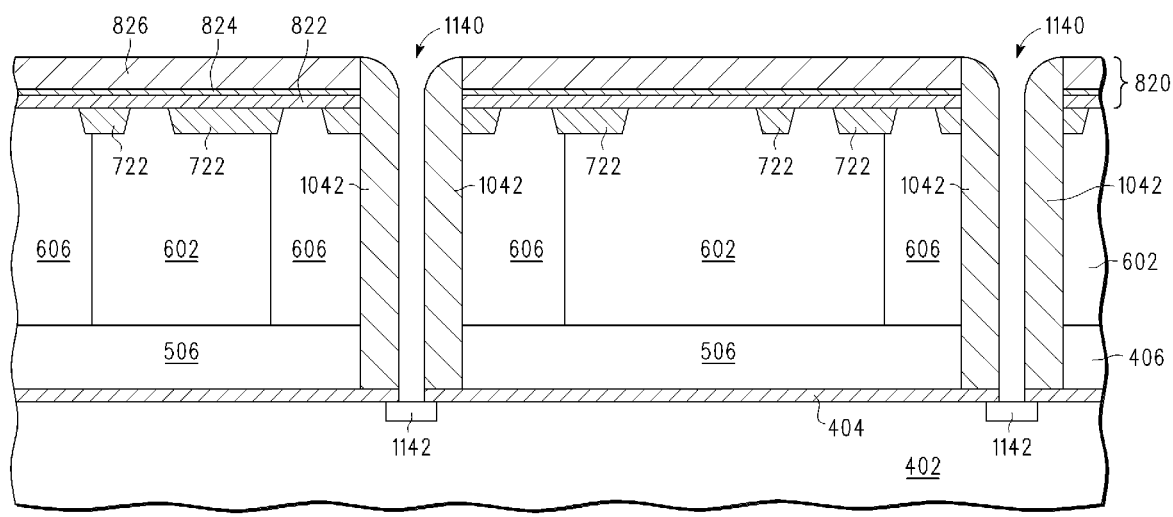
FIG. 11 includes an illustration of a cross-sectional view of the workpiece of FIG. 10 after anisotropically etching the insulating layer to expose portions of the substrate.

FIG. 11 includes an illustration of a cross-sectional view after etching portions of the insulating layer 1042 and buried insulating layer 402 along the bottom of the trenches to form tapered trenches 1140. An anisotropic etch is used to remove portions of the insulating layer 1042 and the buried insulating layer 404. In a particular embodiment, an oxide etchant is used to etch the insulating layer 1042 and the buried insulating layer 404. In one embodiment, the etch is performed as a timed etch, and in another embodiment is performed using endpoint detection combined with a timed overetch. Some of the oxide film 826 may also be eroded when forming the tapered trenches 1140. Even if all of the oxide film 826 is eroded, the nitride film 824 can protect underlying portions. Therefore, the presence of the nitride film 824 allows for more process margin should an overetch be used during etching in forming the tapered trenches 1140.

In one embodiment, doped regions 1142 can be formed along the exposed to portions of the semiconductor substrate 402 along the bottoms of the tapered trenches 1140. In a particular embodiment, the doped regions 1142 are heavily doped and have the same conductivity type as the semiconductor substrate 402. The doped regions 1142 help to lower electrical contact resistance to a subsequently-formed conductive structure. In another embodiment, the doped regions 1142 may be formed at a later time. For example, a subsequently-formed conductive structure can include a doped semiconductor material, wherein the dopant is driven from the doped semiconductor material to form the doped regions similar to the doped regions 1142 illustrated in FIG. 11. In another still embodiment (not illustrated), the doped regions 1142 are not formed or are only be formed at the bottoms of only some of the tapered trenches 1140.

Figure 12:
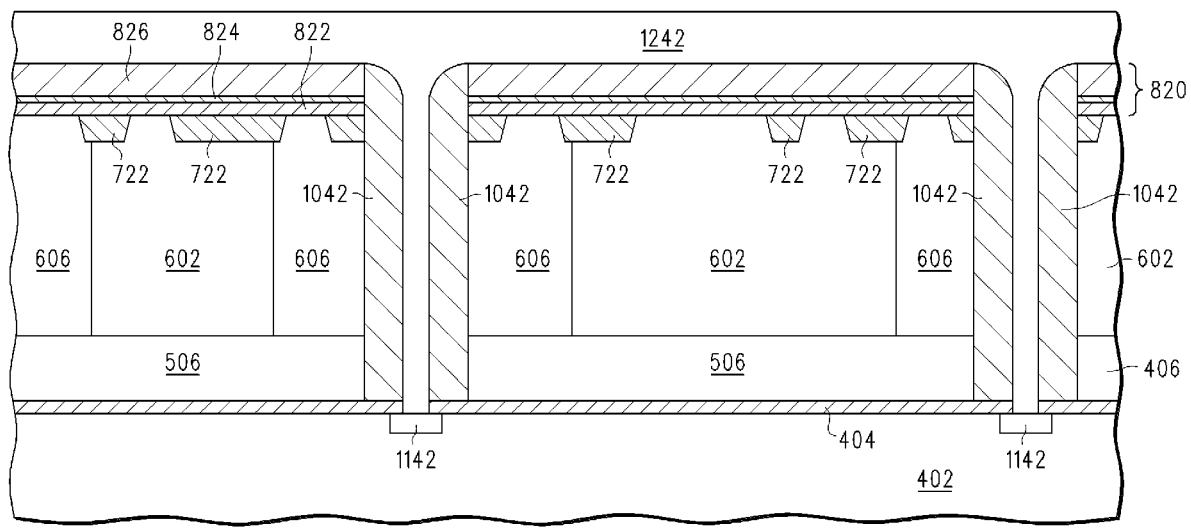
FIG. 12 includes an illustration of a cross-sectional view of the workpiece of FIG. 11 after forming a conductive layer that substantially fills remaining portions of the trenches.

FIG. 12 includes an illustration of a cross-sectional view after forming a conductive layer 1242 within the tapered trenches and over the hard mask layer 820. The conductive layer 1242 includes one or more conductive films having the same or different compositions. In one embodiment, the conductive layer 1242 includes a doped silicon layer. In another embodiment, a refractory metal by itself or in a molecular form is deposited. For example, the conductive layer can include tungsten, TiN, TiSiN, TaSiN, PtSi, or another conductive material capable of withstanding a temperature up to approximately 1100° C. for approximately 30 seconds. Therefore, many different refractory metals, their silicides, their nitrides, their silicon nitrides, their silicon oxynitrides, or any combination thereof can be used. The thickness of the conductive layer 1242 is selected so that the conductive layer 1242 substantially completely fills the tapered trenches 1142. In one embodiment, the conductive layer 1242 has a thickness such that the exposed surface of the conductive layer 1242 is substantially flat or undulating. In a particular embodiment, the conductive layer 1242 has a thickness in a range of approximately 0.2 to approximately 2 microns. In another embodiment, the conductive layer 1242 can be thicker or thinner than the thicknesses previously described. In a particular embodiment, the conductive structure 1242 can include a conductive film that is used to form a self-aligned silicide region formed near the bottom of the tapered opening 1142, and another conductive film that substantially fills the remaining portion of the tapered opening 1142. The conductive layer 1242 can be formed using a conventional or proprietary deposition process.

Figure 13:
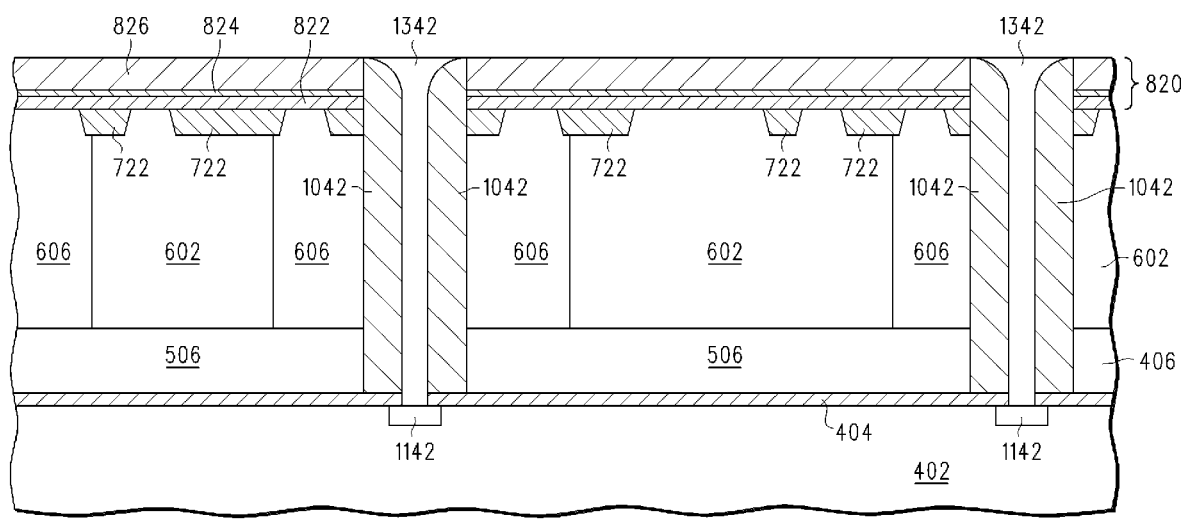
FIG. 13 includes an illustration of a cross-sectional view of the workpiece of FIG. 12 after removing portions of the conductive layer overlying the hard mask layer to form a conductive structure.

FIG. 13 includes a cross-sectional view after removing portions of the conductive layer 1242 overlying the hard mask layer 820 to form the conductive structure 1342. A conventional or proprietary blanket etch or chemical mechanical process is used. The process can use endpoint detection when the hard mask layer 820 becomes exposed. An overetch can be used to ensure that stringers or other conductive filaments do not remain over the hard mask layer 820. At this point in the process, the conductive structure 1342 has been formed. The conductive structure can have a layout as illustrated in FIGS. 1, 2, 3, or another layout as needed or desired for a particular integrated circuit.

Figure 14:
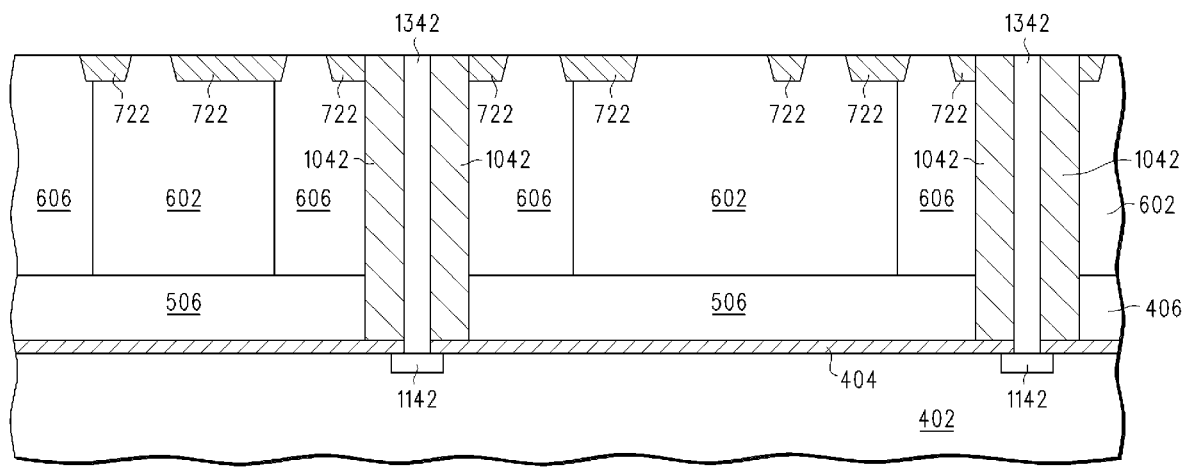
FIG. 14 includes an illustration of a cross-sectional view of the workpiece of FIG. 13 after removing remaining portions of the hard mask layer.

FIG. 14 includes an illustration of a cross-sectional view after removing remaining portions of the hard mask layer 820. Portions of the conductive structure 1342, the insulating layer 1042, the field isolation regions 722, or any combination may also be removed when the remaining portions of the hard mask layer 820 are removed. The remaining portions of the hard mask layer 820 are removed by etching, polishing, or combination thereof, using a conventional or proprietary process technique. In one embodiment, portions of the semiconductor layer 602, the link regions 606, and field isolation regions 722 become exposed. At this point in the process, a variety of different components may be formed using the exposed portions of the semiconductor layer 602.

Figure 15:
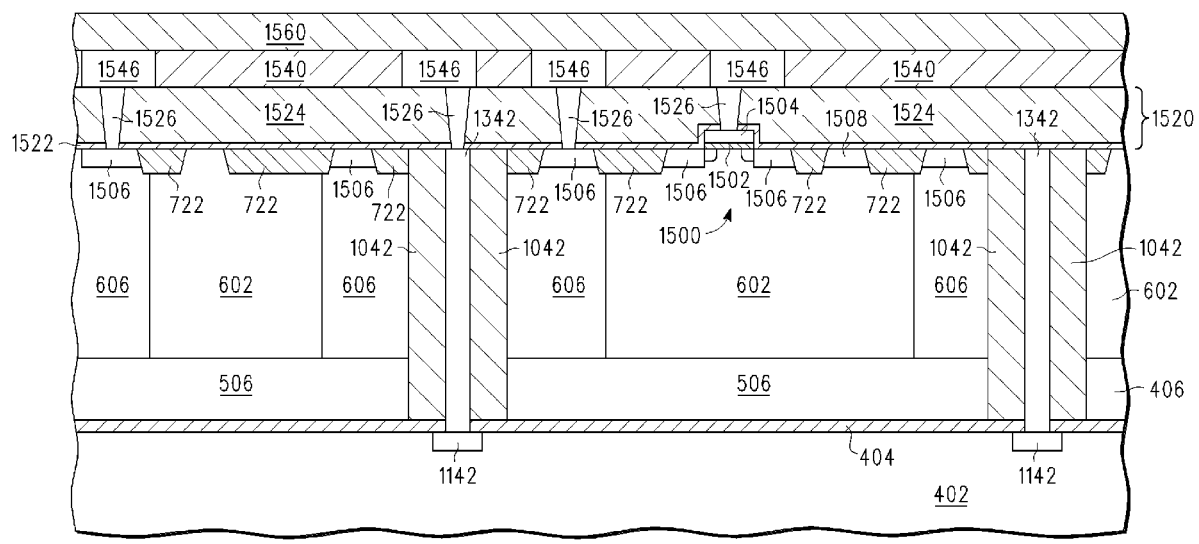
FIG. 15 includes an illustration of a cross-sectional view of the workpiece of FIG. 14 after a substantially completed integrated circuit.

FIG. 15 includes an illustration of a cross-sectional view of a substantially completed integrated circuit. A gate dielectric layer 1502 and a gate electrode 1504 are sequentially formed and patterned to make a gate structure for a transistor 1500. A resist mask (not illustrated) is formed over portions of the semiconductor layer 602 that are not to receive an n-type dopant. Openings within the resist mask allow a dopant to be introduced within exposed regions of the semiconductor layer 602. Heavily doped n-type regions 1506 are formed within portions of the semiconductor layer 602 and the link regions 606. The heavily doped n-type regions 1506 can act as source/drain regions, n-well tie regions, electrical contact regions, emitter regions, another suitable region for a component, or any combination thereof. The resist mask is removed using a conventional or proprietary technique. Another resist mask (not illustrated) is formed over portions of the semiconductor layer 602 that are not to receive a p-type dopant. Openings within this other resist mask allow a dopant to be introduced within exposed regions of the semiconductor layer 602. Heavily doped p-type regions 1508 are formed within portions of the semiconductor layer 602. The heavily doped p-type regions 1508 can act as source/drain regions, p-well tie regions, electrical contact regions, extrinsic base regions, another suitable region for a component, or any combination thereof. The other resist mask is removed using a conventional or proprietary technique. Although not illustrated, other doping process sequences, electrical component formation sequences, or any combination thereof may be performed but are not illustrated in FIG. 15.

An interlevel insulating layer 1520 is formed over the electronic components. In one embodiment, the interlevel insulating layer 1520 includes a nitride film 1522 and an oxide film 1524. The nitride film 1522 helps to provide endpoint detection after etching contact openings through the oxide film 1524 and protects the underlying electronic components or other portions of the integrated circuit near the end of etching contact openings through the oxide film 1524. In another embodiment, more or fewer layers may be formed at this time. In one embodiment, the interlevel insulating layer 1520 can include a material having a low dielectric constant ("low-k"), such as oxide doped with fluorine, chlorine, another suitable dopant or any combination thereof, or an organic material, such as paralene. After reading this specification, skilled artisans will appreciate that other materials can be used in the interlevel insulating layer 1520. The interlevel insulating layer 1520 can be formed using conventional or proprietary deposition techniques.

The interlevel insulating layer 1520 is patterned using conventional or proprietary lithographic techniques to form contact openings where contacts are to be made. Conductive plugs 1526 are formed within the contact openings and extend to portions of the underlying components, structures, and doped regions. In one embodiment, a conductive material can be deposited within the contact openings to substantially fill the contact openings and etched back or polished to removing portions of the conductive material overlying the interlevel insulating layer 1520 to form the conductive plugs 1526.

Another interlevel insulating layer 1540 is formed over the conductive plugs 1526 and interlevel insulating layer 1520. The interlevel insulating layer 1540 can include any of the films or materials as described with respect to the interlevel insulating layer 1520. The interlevel insulating layer 1540 can have the same or different composition as compared to the interlevel insulating layer 1520. The interlevel insulating layer 1540 can be formed using conventional or proprietary deposition techniques. The interlevel insulating layer 1540 is then patterned to define interconnect trenches where interconnects are subsequently formed. The interconnect trenches are formed using a conventional or proprietary lithographic technique. Interconnects 1546 are formed by any depositing another conductive material within the interconnect trenches and over the interlevel insulating layer 1540 and etching or polishing portions of the conductive material that lie outside the interconnect trenches.

Additional levels including interlevel insulating layers, conductive plugs, and interconnects can be formed if needed or desired. A passivation layer 1560 is formed over the uppermost lying interconnect level. The passivation layer 1560 includes one or more films including an oxide, a nitride, an oxynitride, or a combination thereof. The passivation layer 1560 can be formed using a conventional or proprietary deposition technique. At this point in the process, the fabrication of the integrated circuit is substantially completed.

Figure 16:
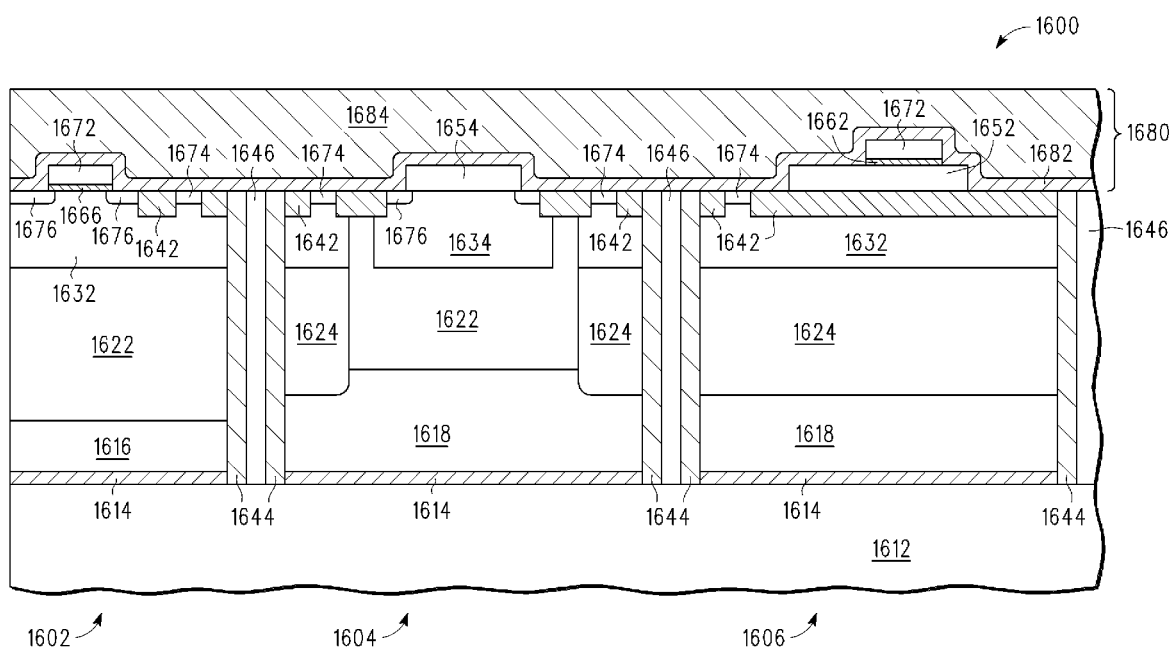
FIGS. 16 and 17 include cross-sectional views of portions of an integrated circuit to illustrate a wide variety of components that can be used in the same integrated circuit.
Figure 17:
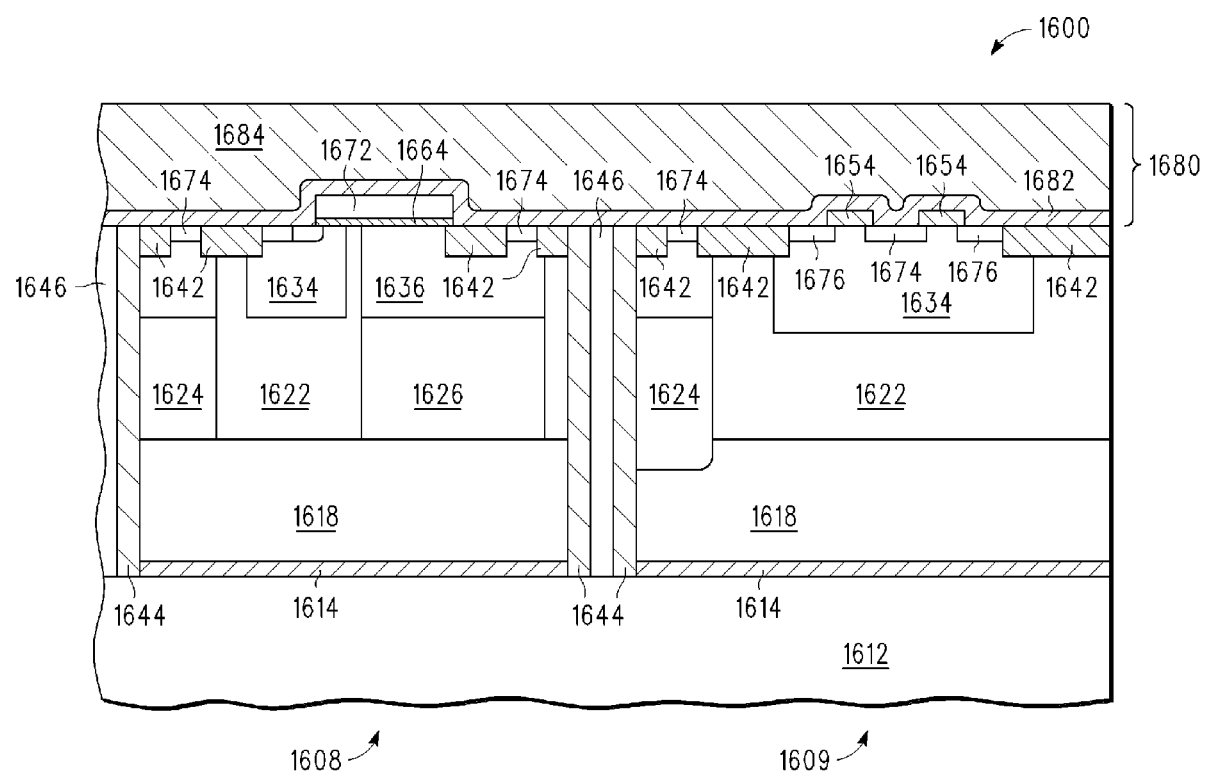

The process and architecture described herein can be used to integrate a variety of different components into the same integrated circuit. FIGS. 16 and 17 include illustrations of cross-sectional views of portions of the integrated circuit to illustrate that different types of components that can be formed using the concepts as previously described. FIGS. 16 and 17 illustrate different portions of the same integrated circuit after forming an interlevel insulating layer and before forming conductive plugs.

As illustrated in the embodiment of FIGS. 16 and 17, the integrated circuit 1600 includes a p-channel transistor 1602 (FIG. 16), a resistor 1604 (FIG. 16) for a high-voltage application, a capacitor 1606 (FIG. 16), a laterally diffused metal oxide semiconductor ("LDMOS") transistor 1608 (FIG. 17), and a bipolar transistor 1609 (FIG. 17) that is designed to operate at a high voltage. Various layers and regions within the integrated circuit 1600 include a substrate 1612, a buried insulating layer 1614 a semiconductor layer 1616, doped regions 1618, another semiconductor layer 1622, link regions 1624, p-type regions 1626, n-well regions 1632, HV p-well regions 1634, and HV n-well regions 1636 (FIG. 17).

The integrated circuit 1600 also includes field isolation regions 1642, portions of an insulating layer 1644, and the conductive structure 1646. In the embodiment as illustrated, the combination of the field isolation regions 1642, the portions of the insulating layer 1644 and the conductive structure 1646 help to electrically insulating the components from one another, such that the components that would otherwise interfere with each other in the absence of the combination now can be placed is closer proximity and allow a smaller integrated circuit to be formed. As illustrated, doped regions do not lie within the substrate 1612 at locations where the conductive structure 1646 abuts the substrate 1612. In another embodiment (not illustrated), doped regions can be formed within the substrate before forming the conductive structure 1646 or by diffusion of dopant from the conductive structure 1646.

Other layers and regions within the integrated circuit 1600 also include a capacitor electrode 1652, a dopant blocking layer 1654, a capacitor dielectric layer 1662, a gate dielectric layer 1664, an electrode layer 1672, heavily doped n-type regions 1674, heavily doped p-type regions 1676, and an interlevel insulating layer 1680 that includes a nitride film 1682 and an oxide film 1684.

After reading this specification, skilled artisans will appreciate that many other components (not illustrated) may also be present within the integrated circuit 1600. For example, the integrated circuit 1600 can include an n-channel transistor, a junction field-effect transistor, a V-shaped or U-shaped field-effect transistor, an insulated gate bipolar transistor, a diode, a pnp bipolar transistor, an inductor, a memory cell (static random access memory cell, dynamic random access memory cell, magnetoresistive random access memory cell, floating gate or nanocrystal memory cell, or the like), an accelerometer, a pressure sensor, a light or radiation sensor, another suitable component, or any combination thereof Additional layers or processing sequences may be used in forming these other components. After reading this specification, skilled artisans will understand how to take conventional or proprietary process sequences in forming those other component and integrate them into a single process flow.

Figure 18:
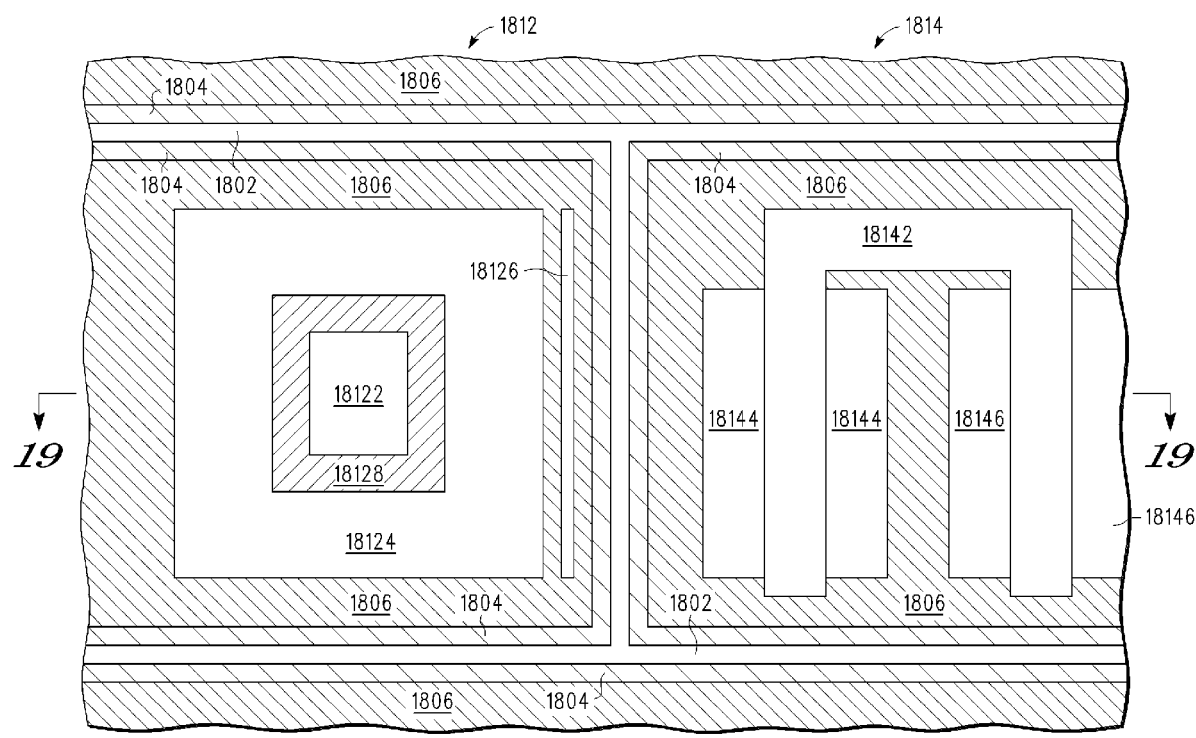
FIGS. 18 and 19 include illustrations of a top view and a cross-sectional view, respectively, of an integrated circuit having a high-voltage section adjacent to a digital logic section, wherein a portion of a conductive structure lies between the high-voltage section and the digital logic section.
Figure 19:
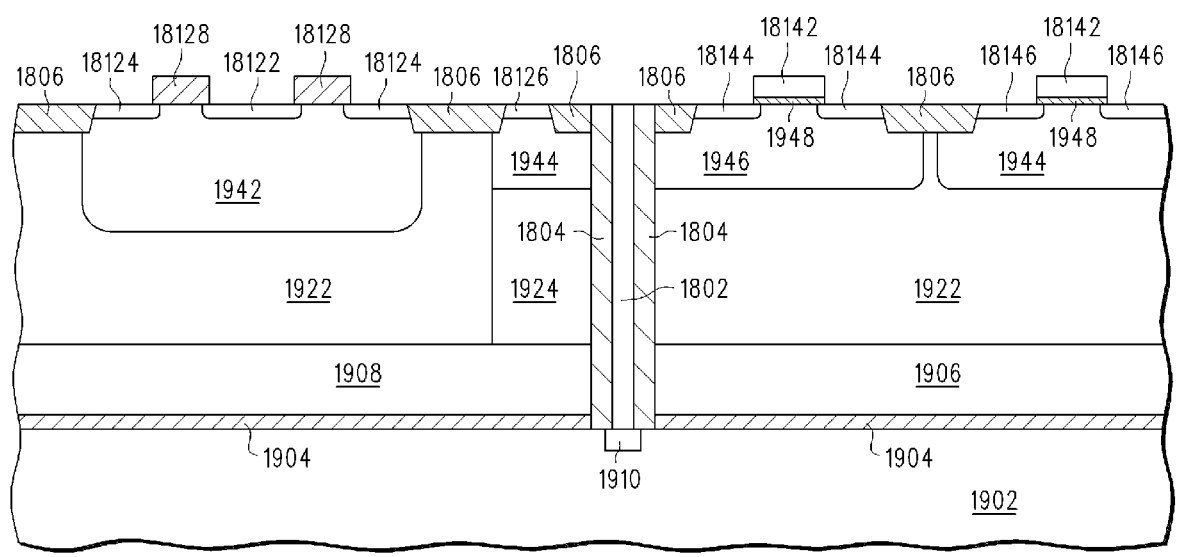

FIGS. 18 to 21 include embodiments to illustrate some significant features. FIGS. 18 and 19 include a top view and a cross-sectional view, respectively, of an integrated circuit 1800 that illustrates some of the positional relationships between a HV section 1812, a digital logic second 1814, and a conductive structure 1802. The HV section 1812 include an npn bipolar transistor that is designed to operate at approximately 40 volts or higher. The digital logic section 1814 includes an inverter that has an n-channel transistor and a p-channel transistor. Unlike the npn bipolar transistor, each of the n-channel and p-channel transistors is designed to operate at approximately 5 volts or lower. The n-channel and p-channel transistors would not operate properly if the voltage difference between source/drain regions of the n-channel transistor or the p-channel transistor would be greater then approximately 5 volts.

Referring to FIG. 18, the npn bipolar transistor includes an emitter region 18122, an extrinsic base region 18124, and a collector contact region 18126. A spacer 18128 lies between the emitter region 18122 and the extrinsic base region 18124 so that the regions are formed spaced apart from each other. The integrate circuit 1800 includes field isolation regions 1806, one of which extends beyond the extrinsic base region 18124 and also surrounds the collector contact region 18126. Portions of an insulating layer 1804 lies along walls of the deep trench, and the conductive structure 1802 extends through that deep trench and abuts the substrate 1902, as illustrate in FIG. 19. Referring again to FIG. 18, a portion of the conductive structure 1802 lies between the HV section 1812 and the digital logic section 1814. Within the digital logic section 1814, the inverter includes a gate electrode 18142 that is common to both the n-channel and p-channel transistors. Source/drain regions 18144 are formed adjacent to opposite sides of a portion of the gate electrode 18142, and source/drain regions 18146 are formed adjacent to opposite sides of another portion of the gate electrode 18142. In one embodiment, the source/drain regions 18144 have an opposite conductivity type as compared to the source/drain regions 18146.

FIG. 19 includes the cross-sectional view of the integrated circuit 1800 at sectioning line 19-19 in FIG. 18. Other portions of the integrated circuit illustrated in FIG. 19 include a semiconductor substrate 1902, a buried insulating layer 1904, a semiconductor layer 1906, a doped region 1908 (which acts as the collector for the bipolar transistor), another semiconductor layer 1922, a link region 1924, an intrinsic base region 1942, n-well regions 1944, a p-well region 1946, and a gate dielectric layer 1948. Each of the layers, features, and other portions of the integrated circuit as illustrated in FIGS. 18 and 19 can be formed as previously described and may use conventional or proprietary materials and processing techniques.

The conductive structure 1802 helps to isolate the HV section 1812 from the digital logic section 1814. In one particular embodiment, the conductive structure 1802 acts as a grounding plane when the integrated circuit 1800 is operating. The npn bipolar transistor within the HV section 1812 can be operated at high voltages without interference with the proper operation of the inverter within the digital logic section 1814, even though the npn bipolar transistor and the inverter are near each other.

Figure 20:
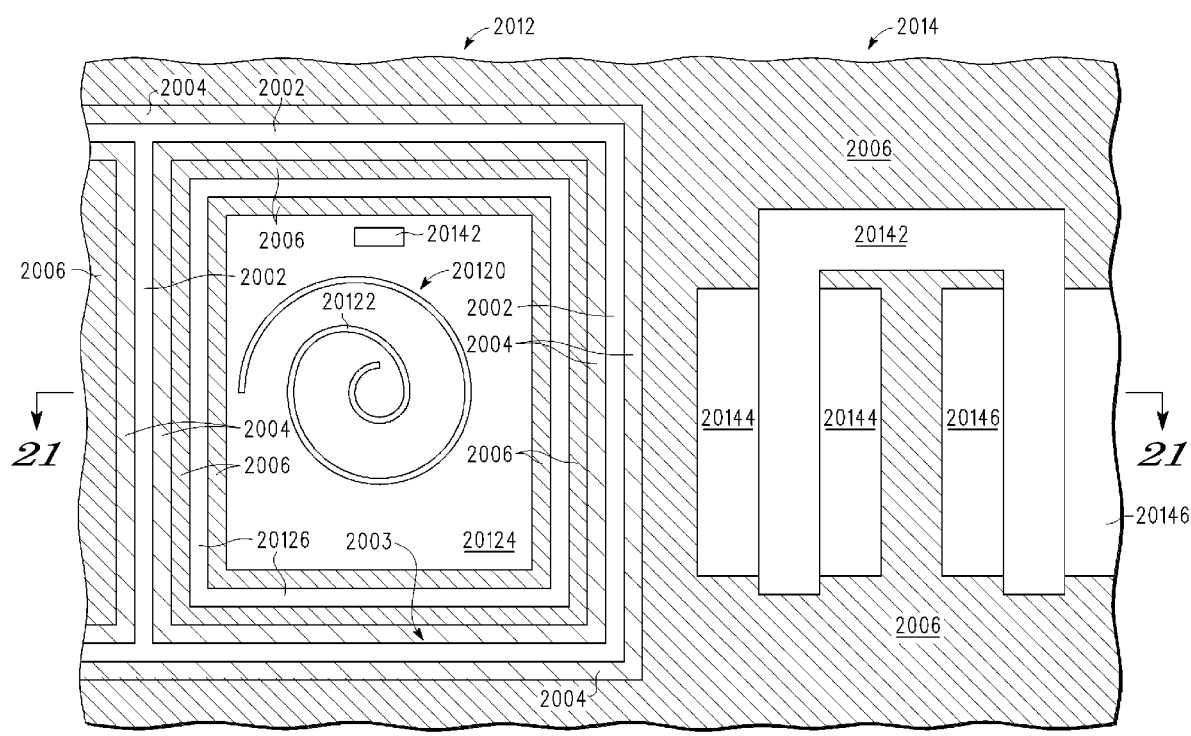
FIGS. 20 and 21 include illustrations of a top view and a cross-sectional view, respectively, of an integrated circuit having a radio-frequency section adjacent to a digital logic section, wherein a portion of a conductive structure lies between the radio-frequency section and the digital logic section.
Figure 21:
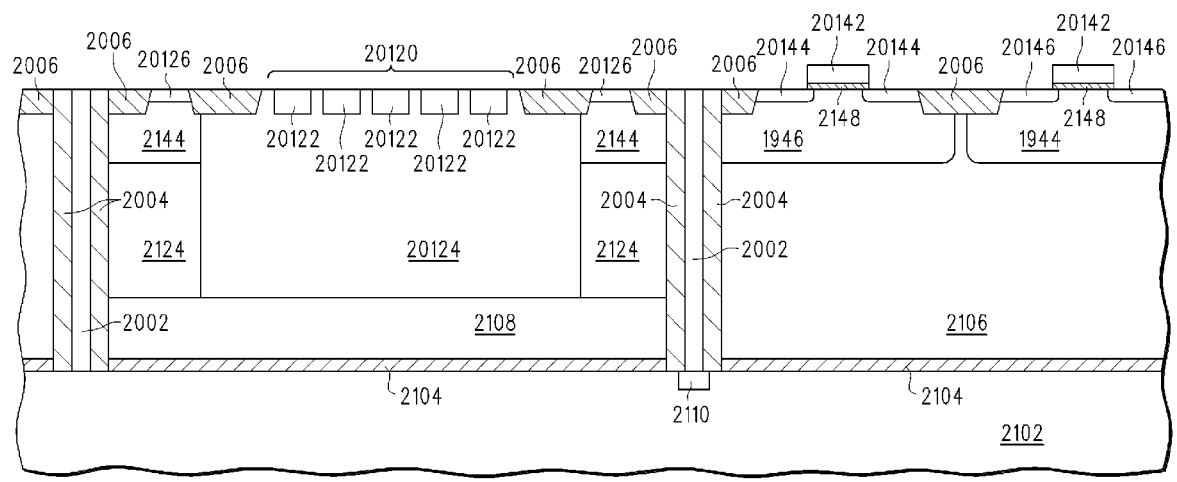

FIGS. 20 and 21 include a top view and a cross-sectional view, respectively, of an integrated circuit 2000 that illustrates some of the positional relationships between an RF section 2012, a digital logic section 2014, and a conductive structure 2002. The conductive structure 2002 can filter or otherwise reduce RF or other electromagnetic noise received by or generated within the RF section 2012 from interfering with the proper operation of the inverter.

The RF section 2012 includes an inductor 20120. In one embodiment, the inductor 20120 includes a doped region 20122 within a semiconductor layer 20124. The doped region 20122 and the semiconductor layer 20124 have opposite conductivity types. A well tie 20128 allows a subsequently formed electrical contact to be made to a portion of the semiconductor layer 20124 that underlies the inductor 20120.

Field isolation regions 2006 include a pair of field isolation regions 2006 that lies on opposites sides of heavily doped n-type region 20126. Other details regarding the heavily doped n-type region 20126 and its relation to underlying regions will be addressed with respect to FIG. 21.

Portions of an insulating layer 2004 lies along walls of the deep trench, and the conductive structure 2002 extends through that deep trench and abuts the substrate 2102, as illustrate in FIG. 21. In the embodiment as illustrated in FIG. 20, the conductive structure 2002 includes an inner perimeter, and the RF section 2012 lies within the inner perimeter. Also, the heavily doped n-type region 20126 lies along the outer perimeter of the RF section 2012 and is substantially equidistant from the inner perimeter of the conductive structure 2002 along all sides of the mesa in which the heavily doped n-type region 20126 lies. A portion of the conductive structure 2002 lies between the RF section 2012 and the digital logic section 2014. As will be described in more detail, such a layout helps to better isolate the RF section 2012 from other parts of the integrated circuit 2000. The conductive structure 2002 does not surround the digital logic section 2014 in one particular embodiment.

Within the digital logic section 2014, the inverter includes a gate electrode 20142 that is common to both the n-channel and p-channel transistors. Source/drain regions 20144 are formed adjacent to opposite sides of a portion of the gate electrode 20142, and source/drain regions 20146 are formed adjacent to opposite sides of another portion of the gate electrode 20142. In one embodiment, the source/drain regions 20144 have an opposite conductivity type as compared to the source/drain regions 20146.

FIG. 21 includes the cross-sectional view of the integrated circuit 2000 at sectioning line 21-21 in FIG. 20. Other portions of the integrated circuit illustrated in FIG. 21 include a semiconductor substrate 2102, a buried insulating layer 2104, a semiconductor layer 2106, a doped region 2108, the semiconductor layer 20124, a link region 2124, the doped region 20122 (of the inductor 20120), n-well regions 2144, a p-well region 2146, and a gate dielectric layer 2148. Each of the layers, features, and other portions of the integrated circuit as illustrated in FIGS. 20 and 21 can be formed as previously described and may use conventional or proprietary materials and processing techniques.

Within the RF section 2012, the combination of the heavily doped n-type region 20126, the n-well region 2144, the link region 2124, and doped region 2108 can be biased to a substantially constant voltage (e.g., approximately 0 volts). In one particular embodiment, the conductive member 2002 can act as a grounding plane and reduce or otherwise filter RF or electromagnetic noise from reaching the substrate 2102 or other parts of the integrated circuit 2000. Thus, the substrate 2102 does not require a high resistivity semiconductor material because high frequency noise can be contained within the RF section 2012.

Embodiments as described herein are beneficial in providing an integrated circuit having a variety of components that can operate without interfering with one another. In one embodiment, an integrated circuit can be designed for a high voltage, high-current architecture with a relatively low-voltage, high-performance digital logic section, reduced parasitic effects and substrate injection. In one particular embodiment, the integrated circuit can include a buried insulating layer, a doped region adjacent to a buried insulating layer within the buried insulating layer, a semiconductor layer overlying the doped region, a trench including a conductive structure that abuts the substrate, and an insulating layer lying between the conductive structure and a sidewall of the trench.

The buried insulating layer reduces the likelihood of a current path via the substrate between components or sections of the integrated circuit. The buried insulating layer can substantially prevent formation of a parasitic component, such as a parasitic pnp bipolar transistor or a pnpn latching component, wherein the substrate would, in the absence of the buried insulating layer, be part of the parasitic component. The buried insulating layer also can substantially eliminate carrier injection to or from the substrate.

In a particular embodiment, the doped region abutting the buried insulating layer can reduce the backgate effect. The semiconductor layer formed over the doped region allows a component to be formed, wherein the component is designed and is operable for a HV application. The link region within the semiconductor layer can be used as part of the component, can substantially eliminate formation of a parasitic field-effect transistor along the sidewall of the trench, or any combination thereof The field isolation regions, such as shallow trench field isolation regions, LOCOS field isolation regions, or the like, can be used to electrically insulate components within the digital logic section from one another. Thus, the integrated circuit includes a digital logic section that is designed with no greater than approximately 200 nm design rules, no greater than approximately 130 nm design rules, no greater than approximately 65 nm design rules, or even smaller. The voltage differences between terminals (gate to source, gate to drain, source to drain, etc.) of the components within the digital logic section can be no greater than 3.3 volts, no greater than 1.8 volts, no greater than 0.9 volts, or the like.

In a more particular embodiment, from a top view the trench surrounds a mesa that includes a component or a section of the integrated circuit. The insulating layer lies along the sidewall of the trench. The combination of the buried oxide layer and the insulating layer along the sidewall of the trench electrically insulates the component or section from another component or section outside of the mesa. Further, the conductive structure within the trench helps to provide better isolation between the component or section within the mesa and another component or section outside the mesa. In a still more particular embodiment, the conductive structure can be placed at a substantially constant voltage when the integrated circuit operates. The combination of the trench and its corresponding insulating layer and conductive member reduce parasitic capacitive coupling between a HV component and a relatively low-voltage component, filter or otherwise reduce RF or other electromagnetic noise between the component or section within the mesa and another component or section outside the mesa. The combination also helps to reduce other crosstalk, switching power dissipation, and reduce spacing between components. Further the conductive structure can also be used to provide a substrate tie through the semiconductor layer and buried insulating layer.

After reading this specifications, skilled artisans will appreciate that any or all of the benefits are not required by the invention, but such benefits may be realized in particular embodiments. The actual benefits and the level of those benefits can vary based on the particular design used for the integrated circuit. Thus, the benefits described herein do not limit the scope of the claims.

After reading this specification, skilled artisans will appreciate that many other different variations can be used to integrate many different types of electronic components into an integrated circuit. The components can include HV components, relatively low-voltage components (e.g., digital logic), components that operate at RF or otherwise generate electromagnetic noise, etc. The use of the conductive structures help to provide robust isolation between many of the components. The conductive structure does not need to extend through all of the field isolation regions. In one embodiment, the conductive structure extends through only some of the field isolation regions. In still another embodiment the trench that includes the conductive structure can be spaced apart away from field isolation regions. Other areas such as within memory arrays may have numerous field isolation regions away from the edge of the array and near the center of the array that will not have the conductive structure extending therethrough.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate, a buried insulating layer overlying the substrate, and a semiconductor layer overlying the buried insulating layer, wherein the semiconductor layer is substantially monocrystalline. The electronic device can also include a conductive structure extending through the semiconductor layer and buried insulating layer and abutting the substrate, and an insulating spacer lying between the conductive structure and each of the semiconductor layer and the buried insulating layer.

In one embodiment of the first aspect, from a top view, the conductive structure has an inner perimeter, and the electronic device further includes a first component lying within the inner perimeter. In a particular embodiment, the semiconductor layer includes a buried region abutting the buried insulating layer, and a link region abutting and electrically connected to the buried region, wherein the buried region lies between the buried insulating layer and the link region. In a more particular embodiment, a mesa includes part of the semiconductor layer and from the top view, the link region lies along substantially all of the outer perimeter of the mesa. In another particular embodiment, the first component belongs to a plurality of components, and the plurality of components lies within the inner perimeter of the conductive structure.

In another embodiment of the first aspect, the electronic device further includes a field isolation region recessed within the semiconductor layer, wherein the conductive structure extends through the field isolation region. In still another embodiment, the substrate includes a doped region that abuts the conductive structure. In yet another embodiment, the conductive structure is at least approximately 1.1 microns deep.

In a further embodiment of the first aspect, the electronic device further includes a first component region that includes a first component including includes a first terminal and a second terminal, wherein the first component is operable when a first voltage difference across the first terminal and the second terminal is at least approximately 40 volts, and a second component region that includes a second component including a third terminal and a fourth terminal, wherein the second component is inoperable when a second voltage difference across the third terminal and the fourth terminal is greater than approximately 40 volts. The conductive structure lies between the first component region and the second component region. In a particular embodiment, the electronic device further includes a third component region, wherein the conductive structure lies between the second component region and the third component region.

In a second aspect, an electronic device can include a substrate, a buried insulating layer overlying the substrate, a first component overlying the substrate and the buried insulating layer, and a second component overlying the substrate and the buried insulating layer, and laterally spaced apart from the first component. The electronic device can also include a conductive structure lying between and electrically insulated from each of the first component and the second component, wherein the conductive structure extends through the buried insulating layer and abuts the substrate.

In one embodiment of the second aspect, the first component comprises a high voltage component, and the second component comprises a low voltage component. In another embodiment, the first component further includes a first terminal and a second terminal, wherein the first component is operable when a first voltage difference across the first terminal and the second terminal is at least approximately 40 volts. In still another embodiment, the second component further includes a third terminal and a fourth terminal, wherein the second component is inoperable when a second voltage difference across the third terminal and the fourth terminal is greater than approximately 40 volts. In still another embodiment, from a top view, the conductive structure surrounds the first component, the second component, or both.

In a further embodiment of the second aspect, the first component is characterized as an RF component. In still a further embodiment, the conductive structure extends to a depth of at least approximately 1.1 microns. In a particular embodiment, the conductive structure includes a doped semiconductor material. In yet a further embodiment, the semiconductor layer includes a buried region abutting the buried insulating layer, and a link region abutting and electrically connected to the buried region, wherein the buried region lies between the buried insulating layer and the link region. In another embodiment, from a top view, the link region surrounds the first component or the second component. In a third aspect, an electronic device can include a substrate having a first heavily doped region therein, wherein the substrate and the first heavily doped region have a first conductivity type. The electronic device can also include a buried insulating layer abutting the substrate. The electronic device can further include a first component and a second component. The first component can include a second heavily doped region having a second conductivity type, wherein the second heavily doped region abuts the buried insulating layer, and a semiconductor layer abutting the second heavily doped region, wherein the semiconductor layer is substantially monocrystalline and includes a link region having the second conductivity type and is heavily doped. The electronic device can still further include a field isolation region lying between the first component and the second component, a conductive structure extending through the field isolation region and the buried insulating layer and abutting the first heavily doped region, a conductive structure terminal electrically connected to the conductive structure, wherein the conductive structure terminal lies closer to the semiconductor layer than the substrate, and an insulating spacer lying between the conductive structure and each of the first component and the second component.

In one embodiment of the third aspect, the first component further includes a first terminal and a second terminal, wherein the first component is operable when a first voltage difference across the first terminal and the second terminal is at least approximately 40 volts, and the second component further includes a third terminal and a fourth terminal, wherein the second component is inoperable when a second voltage difference across the third terminal and the fourth terminal is greater than approximately 40 volts.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
an SOI substrate including:
a base material;
a buried insulating layer overlying the base material;
a semiconductor layer overlying the buried insulating layer, wherein the semiconductor layer is substantially monocrystalline;
a doped region within the base material, wherein the doped region and the base material have a same conductivity type, and the doped region is at an elevation below and abuts the buried insulating layer;
a first component lying within the semiconductor layer, wherein substantially all of the first component overlies the base material;
a conductive structure extending through the semiconductor layer and the buried insulating layer, wherein:
from a top view, the conductive structure has an inner perimeter, and the first component lies within the inner perimeter;
the conductive structure abuts the doped region; and
the conductive structure is electrically connected to the base material via the doped region; and
an insulating spacer lying between the conductive structure and each of the semiconductor layer and the buried insulating layer.

2. The electronic device of claim 1, wherein the first component includes a transistor, an inductor, a memory cell, an accelerometer, a pressure sensor, an RF component, or a capacitor having a dielectric layer.

3. The electronic device of claim 2, wherein the semiconductor layer comprises:
a buried region abutting the buried insulating layer; and
a link region abutting and electrically connected to the buried region, wherein the buried region lies between the buried insulating layer and the link region.

4. The electronic device of claim 3, wherein a mesa includes part of the semiconductor layer and from the top view, the link region lies along substantially all of the outer perimeter of the mesa.

5. The electronic device of claim 2, wherein:
the first component belongs to a plurality of components; and
the plurality of components lies within the inner perimeter of the conductive structure.

6. The electronic device of claim 1, wherein the base material is lightly doped, and the doped region is heavily doped, and the conductive structure includes a refractory metal containing material.

7. The electronic device of claim 6, further comprising a field isolation region recessed within the semiconductor layer, wherein the conductive structure extends through the field isolation region.

8. The electronic device of claim 6, further comprising:
a first component region that includes the first component that is a high voltage component; and
a second component region that includes a low voltage component, wherein substantially all of the low voltage component overlies the base material.

9. The electronic device of claim 8, further comprising a third component region, wherein the conductive structure lies between the second component region and the third component region.

10. An electronic device comprising:
an SOI substrate:
a semiconductor substrate being lightly doped;
a buried insulating layer abutting the semiconductor substrate; and
a semiconductor layer overlying the buried insulating layer, wherein:
the semiconductor layer is substantially monocrystalline; and
the buried insulating layer is an only insulating layer between the semiconductor substrate and the semiconductor layer;
a first heavily doped region within the semiconductor substrate, wherein the semiconductor substrate and the first heavily doped region have a first conductivity type;

a first component including:
   a second heavily doped region having a second conductivity type, wherein the second heavily doped region abuts the buried insulating layer; and
   a first portion of the semiconductor layer abutting the second heavily doped region, wherein a second portion of the semiconductor layer includes a link region having the second conductivity type and is heavily doped;
a second component;
a field isolation region lying between the first component and the second component;
a conductive structure extending through the field isolation region and the buried insulating layer, abutting the first heavily doped region, and electrically connected to the semiconductor substrate via the first heavily doped region, wherein from a top view, a straight line from any point of the first component to any point of the second component passes through the conductive structure;
an interconnect electrically connected to and overlying the conductive structure, wherein the interconnect lies closer to the semiconductor layer than the semiconductor substrate; and
an insulating spacer lying between the conductive structure and each of the first component and the second component,
wherein substantially all of the first component and substantially all of the second component overlie the semiconductor substrate.

11. The electronic device of claim 10, wherein from a top view, the conductive structure surrounds the first component, the second component, or both.

* * * * *